US009899840B2

(12) United States Patent
Martin et al.

(10) Patent No.: US 9,899,840 B2
(45) Date of Patent: Feb. 20, 2018

(54) PHOTOVOLTAIC PLANT LINKED TO A HIGH-VOLTAGE ELECTRICAL NETWORK

(71) Applicant: Commissariat a l'Energie Atomique et aux Energies Alternatives, Paris (FR)

(72) Inventors: Jérémy Martin, Bourdeau (FR); Eric Pilat, Brison-Saint-Innocent (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 215 days.

(21) Appl. No.: 14/907,438

(22) PCT Filed: Jul. 29, 2014

(86) PCT No.: PCT/FR2014/051961
§ 371 (c)(1),
(2) Date: Jan. 25, 2016

(87) PCT Pub. No.: WO2015/015112
PCT Pub. Date: Feb. 5, 2015

(65) Prior Publication Data
US 2016/0172858 A1 Jun. 16, 2016

(30) Foreign Application Priority Data

Jul. 30, 2013 (FR) ...................... 13 57528

(51) Int. Cl.
H02J 1/00 (2006.01)
H02J 3/34 (2006.01)
(Continued)

(52) U.S. Cl.
CPC ................ *H02J 3/34* (2013.01); *H02J 3/383* (2013.01); *H02M 7/44* (2013.01); *H02M 2001/0077* (2013.01); *Y02E 10/563* (2013.01)

(58) Field of Classification Search
CPC .. H02J 3/34; H02J 3/383; H02M 7/44; H02M 2001/0077; Y02E 10/563
See application file for complete search history.

(56) References Cited

U.S. PATENT DOCUMENTS

2010/0288327 A1* 11/2010 Lisi ................... H01L 31/02021
136/244
2012/0215372 A1* 8/2012 Kernahan ......... H01L 31/02021
700/298
2013/0155735 A1* 6/2013 Ilic .......................... H02M 7/72
363/71

FOREIGN PATENT DOCUMENTS

DE 102008032813 A1 1/2010
DE 102010060398 A1 5/2012
WO 2010078669 A1 7/2010

OTHER PUBLICATIONS

English translation of the Written Opinion of the International Searching Authority filed in PCT/FR2014/051961; 5 pgs.
(Continued)

Primary Examiner — Daniel Cavallari
(74) Attorney, Agent, or Firm — Moreno IP Law LLC

(57) ABSTRACT

The invention concerns a photovoltaic plant intended to be linked to a single-phase or multiphase electrical network of which at least one effective voltage of a phase is greater than or equal to 3 kV. The photovoltaic plant comprises at least one first field of photovoltaic modules linked to a first inverter and a second field of photovoltaic modules linked to a second inverter, the first and second inverters being connected in series, the first inverter being linked to the electrical network, each photovoltaic module of the first field of photovoltaic modules having a breakdown voltage greater than or equal to 20 kV. There is no galvanic isolation between the network and the first and second fields of photovoltaic modules.

11 Claims, 4 Drawing Sheets

(51) Int. Cl.
*H02J 3/38* (2006.01)
*H02M 7/44* (2006.01)
*H02M 1/00* (2006.01)

(56) References Cited

OTHER PUBLICATIONS

International Search Report filed in PCT/FR2014/051961; dated Sep. 18, 2014; 2 pgs.

* cited by examiner

PHOTOVOLTAIC PLANT LINKED TO A HIGH-VOLTAGE ELECTRICAL NETWORK

The present patent application claims the priority benefit of French patent application FR13/57528 which is herein incorporated by reference.

BACKGROUND

The present application relates to photovoltaic power plants intended to be connected to a single-phase or polyphase high-voltage AC electrical network.

DISCUSSION OF THE RELATED ART

FIG. 1 shows an example of a photovoltaic power plant 10 connected to a three-phase electrical network 12, schematically shown by three lines $L_1$, $L_2$, $L_3$. Photovoltaic power plant 10 comprises an assembly 14, also called field, of photovoltaic modules 16 connected in series and in parallel. Field 14 of photovoltaic modules 16 is connected to an inverter 18. A transformer 20 connects inverter 18 to electrical network 12. Inductances 22 are generally present between inverter 18 and transformer 20.

Each photovoltaic module 16 generally appears in the form of a panel most often having the shape of a cuboid, containing a plurality of photovoltaic cells integrated in a multilayer structure. Field 14 of photovoltaic modules 16 delivers a DC voltage $V_{BUS}$ to inverter 18. Inverter 18 outputs three sinusoidal voltages at the frequency of electrical network 12, for example, 50 Hz, on lines $L'_1$, $L'_2$ and $L'_3$ based on DC voltage $V_{BUS}$. These voltages form a three-phase system, preferably balanced, that is, they have the same peak-to-peak amplitude and are phase-shifted by 120° with respect to one another. Transformer 20 enables to rise from the low AC voltage to the high AC voltage.

For certain high-voltage electrical networks, the effective voltage between two of lines $L_1$, $L_2$, $L_3$ in the electric distribution is equal to 20 kV for applications where the injected power is greater than 250 kVA. For known photovoltaic power plants, voltage $V_{BUS}$ is generally lower than 1,000 V, for example, between 400 V and 800 V, and the effective voltage between two of lines $L'_1$, $L'_2$, $L'_3$ is several hundreds of volts, for example, in the order of 400 V.

The number of photovoltaic modules 16 particularly depends on the electric power to be output by photovoltaic power plant 10. For electric powers greater than 1 MW, photovoltaic power plant 10 may comprise several tens of thousands of photovoltaic modules 16. This may cause the occurrence of strong currents, for example of more than 1,000 A, in the cables connecting photovoltaic modules 16 to inverter 18 and inverter 18 to transformer 20. These cables may extend along large lengths, particularly in the case of photovoltaic power plants covering several hectares. Cables having a large cross-section area, for example, 120 mm² or 300 mm², are then used to decrease power losses by Joule effect.

A disadvantage of photovoltaic power plant 10 is that the cost of the cables amounts to a significant part of the manufacturing cost of a photovoltaic power plant, mainly due to the high cost of the metallic materials forming the cables.

Another disadvantage of photovoltaic power plant 10 is that transformer 20 is an expensive and bulky part, which induces a loss in the power efficiency of photovoltaic power plant 10.

SUMMARY

An object of an embodiment is to overcome all or part of the disadvantages of previously-described photovoltaic power plants.

Another object of an embodiment is to decrease the cross-section area of cables used in the photovoltaic power plant to connect the photovoltaic modules to the inverter and the inverter to the electrical network.

Another object of an embodiment is to suppress the transformer connecting the inverter to the high-voltage electrical network.

Another object is to improve the waveform supplied by the converter.

Thus, an embodiment provides a photovoltaic power plant intended to be connected to a single-phase or polyphase electrical network having at least one effective voltage of a phase greater than or equal to 3 kV. The photovoltaic power plant comprises at least a first field of photovoltaic modules directly connected to a first inverter and a second field of photovoltaic modules directly connected to a second inverter, the first and second inverters being series-connected, the first inverter being connected to the electrical network, each photovoltaic module of the first field of photovoltaic modules having a breakdown voltage greater than or equal to 20 kV, and there is no galvanic isolation between the network and the first and second fields of photovoltaic modules.

According to an embodiment, the photovoltaic power plant comprises at least one third field of photovoltaic modules directly connected to a third inverter, the third inverter being series-connected with the second inverter.

According to an embodiment, the photovoltaic power plant is intended to be connected to a single-phase or polyphase electrical network having at least one effective voltage of a phase in the range from 3 kV to 25 kV. Each photovoltaic module of the first field of photovoltaic modules has a breakdown voltage in the range from 20 kV to 130 kV and advantageously in the range from 60 kV to 130 kV.

According to an embodiment, all the photovoltaic modules of all the fields of photovoltaic modules of the photovoltaic power plant have a breakdown voltage greater than or equal to 20 kV.

According to an embodiment, the photovoltaic power plant is intended to be connected to a three-phase electrical network having its effective composite voltages greater than 3 kV. The photovoltaic power plant comprises, for each phase of the electrical network, at least the first field of photovoltaic modules directly connected to the first inverter and the second field of photovoltaic modules directly connected to the second inverter, the first and second inverters being series-connected, the first inverter being connected to said phase, each photovoltaic module of the first field of photovoltaic modules having a breakdown voltage greater than or equal to 20 kV, and there is no galvanic isolation between the network and the first and second fields of photovoltaic modules.

According to an embodiment, each photovoltaic module of the first field rests on a support and comprises photovoltaic cells surrounded with an encapsulation layer forming first and second opposite surfaces and a coating covering at least the most part of the first surface, and a holding device for keeping an air film between the support and the coating.

According to an embodiment, the coating comprises protruding portions in contact with the support.

According to an embodiment, at least each photovoltaic module of the first field further comprises, for each protruding portion, a pad between the coating and the first surface.

According to an embodiment, each protruding portion delimits a housing filled with air and at least partly filled with the material forming the encapsulation layer.

According to an embodiment, the height of each protruding portion varies from 1 mm to 20 mm.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
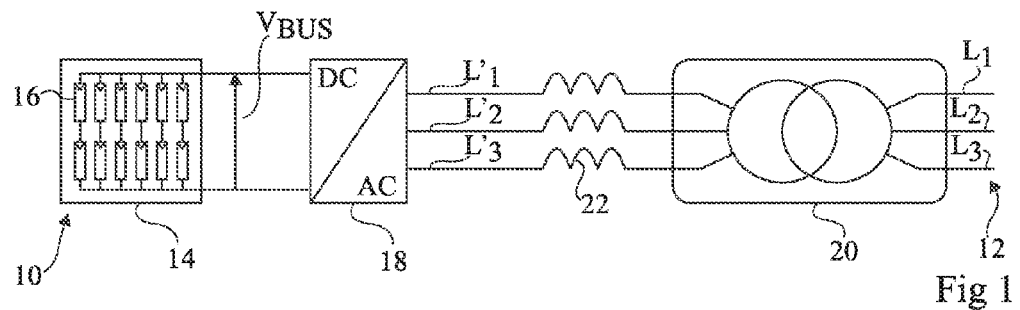
FIG. 1, previously described, partially and schematically shows an example of a known photovoltaic power plant connected to a three-phase electrical network.

For clarity, the same elements have been designated with the same reference numerals in the various drawings and, further, the various drawings are not to scale. In the following description, unless otherwise indicated, terms "substantially", "approximately", and "in the order of" mean "to within 10%". Further, only those elements which are useful to the understanding of the present description have been shown and will be described. In particular, inverters are circuits well known by those skilled in the art and have not been described in further detail. In the rest of the description, photovoltaic module designates a device containing a plurality of integrated photovoltaic cells assembled in series and/or in parallel. An assembly of series-connected photovoltaic modules is called chain of photovoltaic modules and an assembly of chains of photovoltaic modules assembled in parallel is called field of photovoltaic modules.

Figure 2:
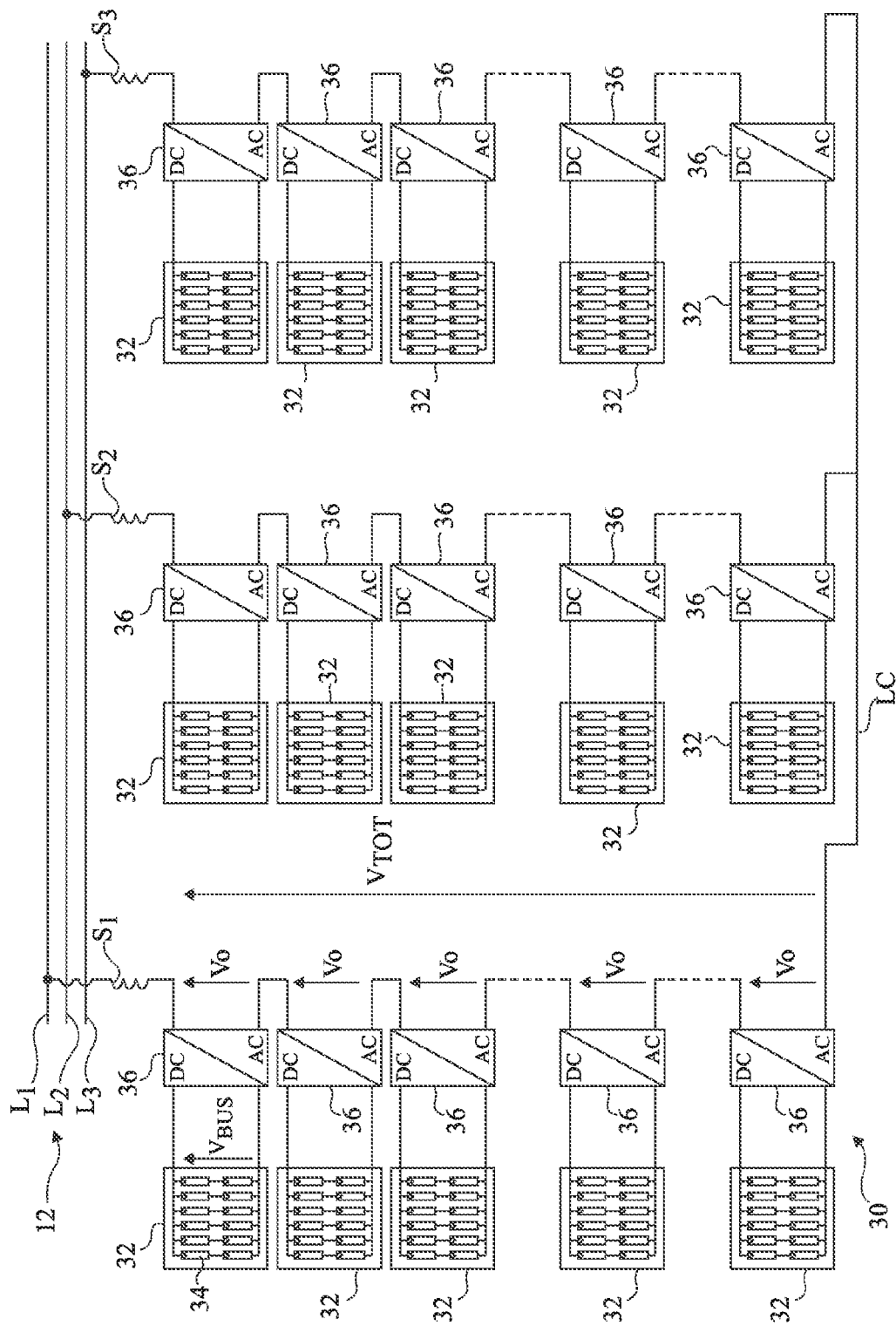
FIG. 2 partially and schematically shows an embodiment of a photovoltaic power plant connected to a three-phase network.

FIG. 2 shows an embodiment of a photovoltaic power plant 30 connected to electrical network 12. For each line $L_1$, $L_2$ or $L_3$, photovoltaic power plant 30 advantageously comprises from 2 to 20 fields 32 of photovoltaic modules 34.

Each field 32 of photovoltaic modules is directly connected to a single-phase inverter 36. Inverters 36 associated with a same line $L_1$, $L_2$ or $L_3$ are series-connected and form a succession of inverters 36 between two end inverters. More specifically, the positive terminal of an inverter 36 is connected to the negative terminal of the next inverter 36 and so on. The positive terminal of an end inverter is connected to the terminal of an inductance $S_1$, $S_2$ or $S_3$ having its other terminal connected to line $L_1$, $L_2$ or $L_3$. Further, the negative terminal of the other end inverter is connected to the inverters 36 associated with the other lines $L_1$, $L_2$ or $L_3$ by a common grounded line LC. Inverters 36 are inverters with no galvanic isolation. Inverters 36 may be high-power inverters comprising deionized water cooling circuits. These for example are inverters cooled by deionized water commercialized by ABB. Photovoltaic power plant 30 comprises no transformer between lines $L_1$, $L_2$ or $L_3$ of network 12 and photovoltaic modules 34. There thus is not galvanic isolation between electrical network 12 and fields 32 of photovoltaic modules 34.

Call $V_{BUS}$ the voltage output by field 32 of photovoltaic modules, Vo the AC voltage output by inverter 36, and $V_{TOT}$ the sum of voltages Vo of the succession of inverters associated with line $L_1$, $L_2$ or $L_3$. The number of fields 32 of photovoltaic modules associated with the same line $L_1$, $L_2$ or $L_3$ may be identical for all lines $L_1$, $L_2$ or $L_3$ or may be different from one line to the other. Preferably, the number of fields 32 of photovoltaic modules associated with the same line $L_1$, $L_2$ or $L_3$ is the same for all lines $L_1$, $L_2$ or $L_3$. Further, fields 32 of photovoltaic modules may be identical or different. Preferably, fields 32 of photovoltaic modules are identical. Preferably, for identical sunlighting conditions, the voltages $V_{BUS}$ output by fields 32 are substantially identical. Photovoltaic modules 34 may be identical or different according to the considered field 32. Preferably, photovoltaic modules 34 are identical.

Photovoltaic power plant 30 is capable of being connected to an electrical network 12 for which the effective voltage between two of lines $L_1$, $L_2$, $L_3$ varies between 3 kV and 25 kV and is for example in the order of 20 kV. As an example, in the case where the effective voltage between two of lines $L_1$, $L_2$, $L_3$ is in the order of 20 kV, effective voltage $V_{TOT}$ is in the order of 32 kV. For a 1-MW total active power output by photovoltaic power plant 30, the effective current crossing each inductance $S_1$, $S_2$ or $S_3$ will be in the order of 30 A.

The currents flowing through the conductors connecting photovoltaic modules 34 to inverters 36 and inverters 36 to lines $L_1$, $L_2$, $L_3$ are decreased with respect to the currents present in photovoltaic power plant 10 shown in FIG. 1. The cross-section area of these conductors can thus be decreased. The quantity of metal used to form the conductors of photovoltaic power plant 30 is decreased by at least 20% with respect to photovoltaic power plant 10 to provide the same active power.

Further, since photovoltaic power plant 30 integrates no transformer between electrical network 12 and photovoltaic modules 34, the power efficiency of photovoltaic power plant 30 is improved with respect to photovoltaic power plant 10.

As an example, considering 12 fields 32 associated with each line $L_1$, $L_2$, $L_3$ and considering that fields 32 of photovoltaic modules are identical, effective DC voltage $V_{BUS}$ is in the order of 3,600 V. The number and the layout of photovoltaic modules 34 in each field 32 of photovoltaic modules may be adapted to directly output voltage $V_{BUS}$. As a variation, a DC/DC voltage step-up circuit may be provided between field 32 of photovoltaic modules and inverter 36 to raise the DC voltage output by field 32 of photovoltaic modules up to an adapted DC voltage from which inverter 36 outputs voltage Vo.

At least some of photovoltaic modules 34 have an improved electrical insulation. Preferably, to comply with certain current standards used for the manufacturing of photovoltaic modules which impose the same constraints relative to the breakdown voltage for all the photovoltaic modules of a photovoltaic power plant, all photovoltaic modules 34 of photovoltaic power plant 30 have an improved electrical insulation. Embodiments of photovoltaic modules 34 having an improved electrical insulation are described hereafter. It may however be envisaged that only part of the photovoltaic modules have an improved electrical insulation. In this case, the photovoltaic modules closest to network 12 will have the highest electrical insulation, and more particularly those of the field connected to inverter 36, itself directly connected to the electrical network. The more remote the fields are from the electrical network, the lower the electrical insulation of the photovoltaic modules may be.

Current standards used to manufacture photovoltaic modules, particularly 61730-2 called "Qualification pour la sûreté de fonctionnement des modules photovoltaïques (PV)—Partie 2: Exigences pour les essais" indicate the minimum breakdown voltage that the photovoltaic module should have according to its use. In particular, standard 61730-2 specifies in chapter 10.6 that photovoltaic modules should be sufficiently insulated to keep a 2,000 V voltage plus four times the maximum voltage of the system for class-A applications or 1,000 V plus twice the maximum voltage of the system for class-B applications. Photovoltaic modules intended for class-A applications may be used in systems operating at more than 50 V DC or 240 W, where a general contact access is provided. Photovoltaic modules intended for class-B applications are restricted to systems protected from public access by fences, their location, etc.

The breakdown voltage of at least certain photovoltaic modules 34 is adapted according to maximum voltage $V_{TOT}$. The breakdown voltage of at least certain photovoltaic modules 34 is at least greater than or equal to 20 kV and advantageously varies between 60 kV and 130 kV. As an example, if photovoltaic module 34 is used in a system having a 30-kV maximum voltage, photovoltaic module 34 should have a breakdown voltage of at least 122 kV for a class-A application and of at least 61 kV for a class-B application.

Figure 3:
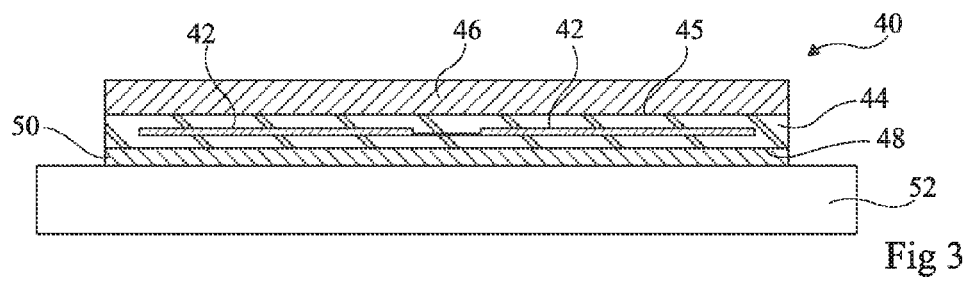
FIG. 3 is a partial simplified cross-section view of an example of a known photovoltaic module.

FIG. 3 is a partial simplified cross-section view of an example of a known photovoltaic module 40 which may correspond to photovoltaic module 16 of photovoltaic power plant 10. Photovoltaic module 40 may correspond to a thin cuboid-shaped panel, having a large side in the order of 1 m and a small side in the order of 1.7 m.

Photovoltaic module 40 comprises photovoltaic cells 42 connected to one another to form a chain of photovoltaic cells. As an example, the number of photovoltaic cells 12 in a photovoltaic module 10 may vary from 60 to 72, only two photovoltaic cells 42 being shown in the cross-section views in the present description. Photovoltaic cells 42 are held in a multilayer structure which ensures the protection of the photovoltaic cells while allowing a proper operation. As an example, photovoltaic cells 42 are encapsulated in an insulating layer 44, called encapsulant hereafter. Encapsulant 44 may correspond to an ethylene vinyl acetate or EVA matrix. Encapsulant 44 comprises a front side 45, intended to receive the sunlight, covered with a front coating 46, generally a glass plate. Encapsulant 44 comprises a back side 48, opposite to front side 45 and covered with a back coating 50. Module 40 rests on a support 52 on the side of back coating 50. Support 52 may correspond to a metal frame. Back coating 50 particularly ensures the protection of photovoltaic cells 42 against humidity and, generally, against chemical pollution. Back coating 50 and encapsulant 44 further ensure the electrical insulation of photovoltaic module 40 with respect to support 52. As an example, back coating 50 is a multilayer structure comprising a polyethylene terephthalate or PET layer sandwiched between two polyvinyl fluoride or PVF layers.

The thickness of back coating 50 may be in the order of 0.3 mm and the thickness of encapsulant 44 between photovoltaic cells 42 and back surface 48 may be in the order of 0.2 mm. The dielectric strength of the EVA material is in the order of 25 kW/mm and the electric strength of a PVF/PET/PVF multilayer structure is in the order of 35 kW/mm. The breakdown voltage of photovoltaic module 40 thus is in this case at best 15.5 kV.

Module 40 shown in FIG. 3 cannot be directly used to form modules 34 of photovoltaic power plant 30 shown in FIG. 2. Indeed, given that there is no galvanic isolation between photovoltaic modules 34 and network 12, at least certain photovoltaic modules 34 are capable of sensing voltage $V_{TOT}$. The breakdown voltage of modules 40 is not sufficient regarding current security standards.

According to the embodiments described hereafter in relation with FIGS. 4 to 11, a spacer device is integrated to the back coating of the photovoltaic module to keep an air film between the photovoltaic module and the support on which it rests. The presence of the air film enables to increase the breakdown voltage of the photovoltaic module without increasing the weight thereof. Further, since the most part of the electrical insulation may be performed by the air film, low-cost materials may be used to form the back coating and/or the encapsulant.

Figure 4:
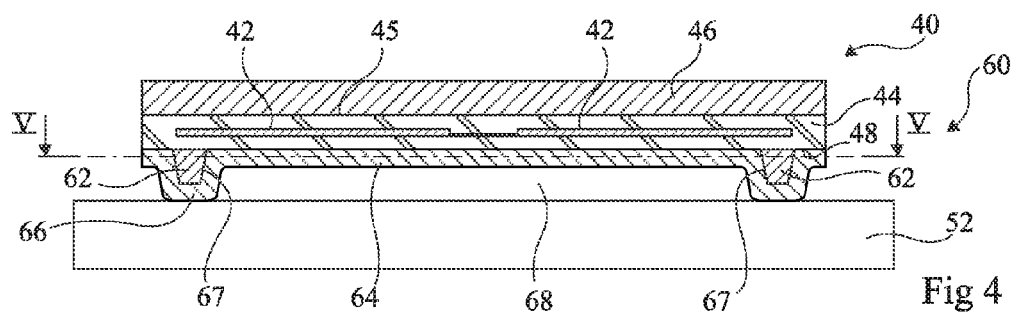
FIG. 4 is a partial simplified cross-section view of an embodiment of a photovoltaic module.
Figure 5:
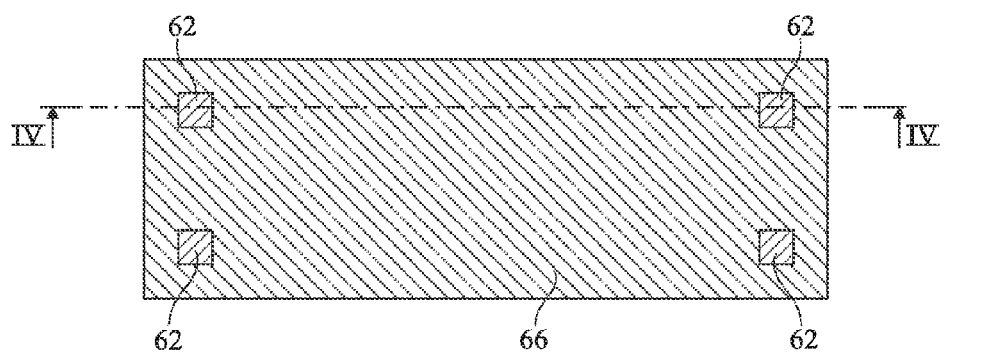
FIG. 5 is a cross-section view of FIG. 4 along line IV-IV.

FIG. 4 is a partial simplified cross-section view of an embodiment of a photovoltaic module 60 and FIG. 5 is a cross-section of FIG. 4 along line V-V.

Encapsulant 44 may be made of EVA such as, for example, the product commercialized by STR under trade name Photocap 15505, of polyvinyl butyral or PVB such as, for example, the product commercialized by Kuraray under trade name Trofisol UV+, of silicone, particularly of polydimethylsiloxane or PDMS, such as for example the product commercialized by Dow Corning under trade name Sylgard 184 or the product commercialized by MG Chemicals under trade name RVT 165, or of thermoplastic silicon elastomer or TPSE such as, for example, the product commercialized by Wacker under trade name Tectosil 167, of polyolefin elastomer or POE or of thermoplastic polyolefin or TPO such as, for example, the product commercialized by Dai Nippon under trade name CVF-2SS, of functionalized polyolefin such as, for example, the product commercialized by Arkema under trade name Apolhya, of a ionomer, particularly a methacrylic ethylene-acid copolymer, such as for example the product commercialized by Jura-plast under trade name Jurasol, or of thermoplastic polyurethane or TPU such as, for example, the product commercialized by Etimex under trade name Vistasolar TPU or the product commercialized by Stevens Urethane under trade name Encapsolar.

In this embodiment, module 60 comprises pads 62 distributed in contact with rear surface 48. Module 60 further comprises a back coating 64 which covers pads 62 and the rest of back side 48. Back coating 64 comprises, for each pad 62, a bulged area 66, also called protruding portion, which defines a housing 67 occupied by pad 62.

The presence of pads 62 causes the forming of an air film 68 between support 52 and the most part of back coating 64, except for the locations where back coating 64 is in contact with support 52. The thickness of air film 68 substantially corresponds to the thickness of pads 62.

As shown in FIG. 5, pads 62 may be provided at the four corners of photovoltaic module 60. However, the shape and the layout of pads 62 may be different from those which have been shown. As a variation, pads 62 may be replaced with a cord which extends over a portion of the periphery of rear surface 48. Preferably, the shape and the layout of pads 62 are selected so that the thickness of air film 68 is substantially constant under the entire module 60 or so that the minimum thickness of air film 68 is greater than a given value.

The thickness of each bulged area 66 corresponds to the thickness of the associated pad 62 and may vary from 1 mm to 20 mm. The thickness of back coating 64 may vary from 0.1 mm to 1 mm, for example, in the order of 0.3 mm. The thickness of encapsulant 44 between photovoltaic cells 42 and rear surface 48 may vary from 0.1 mm to 1 mm, for example, in the order of 0.3 mm.

The material forming pads 62 is selected to have a dielectric strength greater than or equal to that of air, that is, greater than or equal to 5 kW/mm. As an example, pads 32 may be made of PET, or polytetrafluoroethylene (PTFE), or ethylene tetrafluoroethylene (ETFE), of polyurethane (PU), or of silicone.

As an example, in the case of pads 62 having a 15-mm thickness, the increase of the breakdown voltage of module 60 due to the presence of air film 68 is in the order of 75 kV.

The increase of the breakdown voltage being obtained by the presence of air film 68, the weight of photovoltaic module 60 is advantageously substantially equal to the weight of photovoltaic module 40. Further, given that the most part of the electric insulation is due to air film 68, the constraints relative to the materials for back coating 64 and encapsulant 44 of photovoltaic module 60 may be decreased with respect to photovoltaic module 40.

Figure 6:
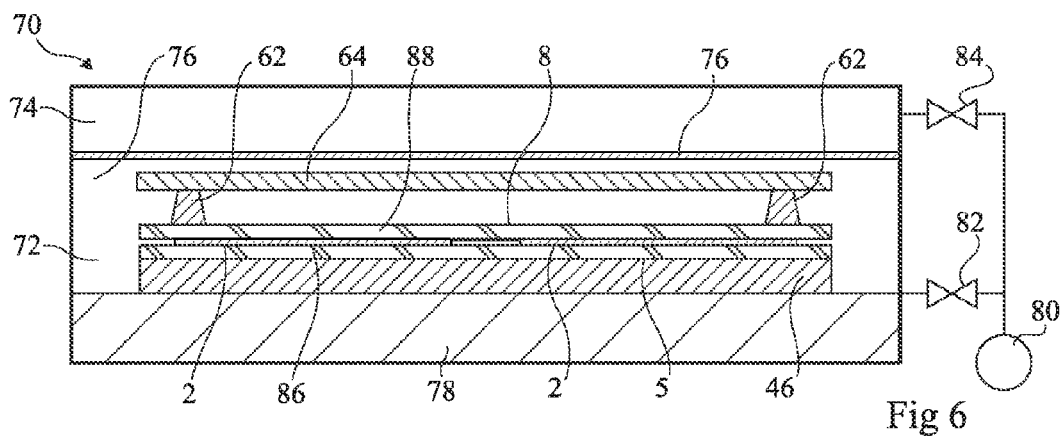
FIGS. 6 and 7 illustrate two steps of an embodiment of a method of manufacturing the photovoltaic module shown in FIG. 4.
Figure 7:
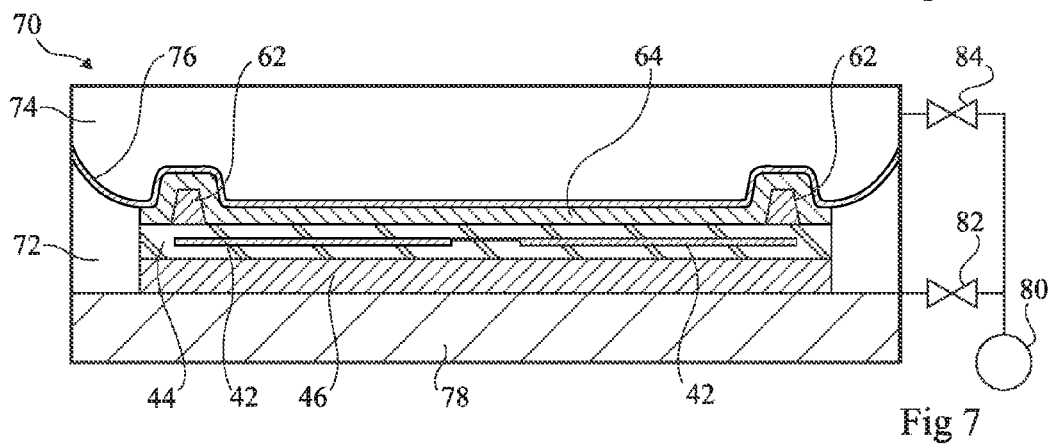

FIGS. 6 and 7 illustrate steps of an embodiment of a method of manufacturing photovoltaic module 60. As an example, photovoltaic module 60 is partly formed in a rolling mill 70. An example of rolling mill 70 is very schematically shown in FIG. 6. Rolling mill 70 comprises a lower chamber 72 and an upper chamber 74, separated from lower chamber 72 by a membrane 76. A hot floor 78 is provided in lower chamber 72. Chambers 72, 74 are connected to a vacuum pump 80 via valves 82, 84. In operation, vacuum pump 80 is capable of keeping the internal volume of lower chamber 72 and/or upper chamber 74 at a pressure in the range from 0.1 Pa to 100 Pa, for example, in the order of 0.1 millimeter of mercury (13 Pa).

An embodiment of a method of manufacturing photovoltaic module 60 comprises the steps of:

(1) connecting photovoltaic cells 42 to one another;

(2) installing films intended to form, after processing, a multilayer structure solid with cells 42. As an example, front coating 46, a first film 86 of a precursor of encapsulant 44, photovoltaic cells 42, a second film 88 of the precursor of encapsulant 44, pads 62, and back coating 50 are successively provided. In the case where back coating 64 corresponds to a multilayer structure, the latter may be formed beforehand;

(3) introducing the stack of films into rolling mill 70 as shown in FIG. 6 and performing a rolling operation during which the films are pressed against one another, bulged areas 66 being then obtained by deformation of back coating 64 to take the shape of pads 72;

(4) performing a thermal processing in rolling mill 70 or in a furnace, this thermal processing particularly causing the polymerization of the materials forming films 86 and 88 to form encapsulant 44 which adheres to front coating 46 and to back coating 50; and (5) possibly cutting the excess matrix of the obtained multilayer structure.

According to an embodiment, the rolling and polymerization step comprises the successive steps of:

(6) introducing the stack of films into lower chamber 72 which is at the atmospheric pressure and where the temperature is for example kept at approximately 100° C. while upper chamber 74 is kept under vacuum;

(7) placing lower chamber 72 under vacuum;

(8) placing upper chamber 74 at the atmospheric pressure. Diaphragm 76 is then pressed against the stack of films as shown in FIG. 7 and in particular presses back coating 64 against pads 62 by chasing the air present between the films. Bulged areas 66 are then obtained by deformation of back coating 64 to take the shape of pads 72;

(9) raising the temperature, for example, up to more than 150° C. in lower chamber 72 for more than 10 minutes to favor a reaction of polymerization of films 86 and 88 at the end of which films 86 and 88 form encapsulation layer 44, which adheres to front and back coatings 46 and 50; and

(10) placing lower chamber 72 at the atmospheric pressure and placing upper chamber 74 under vacuum to remove photovoltaic module 60 from mill 70.

As a variation, after step (8), the obtained structure may be displaced into a furnace to carry out step (9).

An advantage of such a manufacturing method is that it causes little or no modifications with respect to a known manufacturing method.

The temperature at which pads 62 start softening is preferably higher than the temperature at which the rolling operation is performed. There thus is no deformation of pads 62 during the rolling operation.

The selection of the material forming back coating 64 should allow a sufficient deformation of this element during the rolling to obtain bulged areas 66. As an example, back coating 34 is made of polymethyl methacrylate (PMMA) such as, for example, the product commercialized by Arkema under trade name Altuglass, or of a material such as reinforced elastomer based on polyurethane or silicone.

In the case where the material forming back coating 64 does not enable to obtain a sufficient deformation during the rolling operation, bulged areas 66 may be formed prior to the rolling operation.

Figure 8:
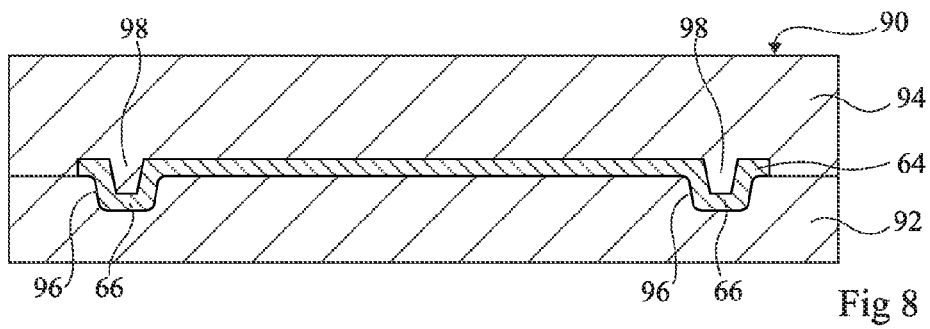
FIGS. 8 and 9 illustrate steps of another embodiment of a method of manufacturing the photovoltaic module shown in FIG. 4.

FIG. 8 illustrates another embodiment of a method of manufacturing photovoltaic module 60. FIG. 8 shows a press 90 comprising a lower matrix 92 and an upper matrix 94. Lower matrix 92 comprises cavities 96 at the desired locations of bulged areas 66 and upper matrix 94 comprises protruding portions 98 at the desired locations of bulged areas 66. The pressing operation locally deforms coating 64 to obtain bulged areas 66 at the desired positions of pads 62.

Figure 9:
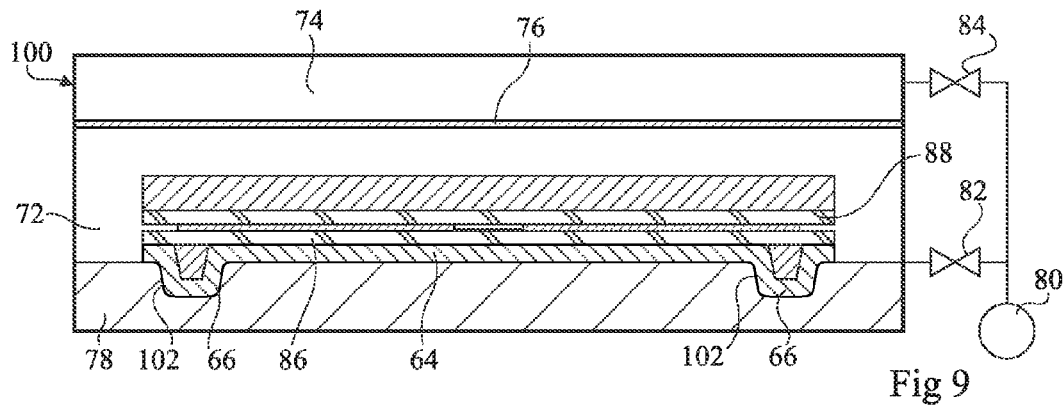

FIG. 9 is a view similar to FIG. 7 of a rolling mill 100 adapted to the case where bulged areas 66 of back coating 64 are previously formed and in the case where back coating 64 is made of a material capable of deforming during the rolling and/or polymerization operations. Rolling mill 100 shown in FIG. 9 is identical to rolling mill 70 shown in FIG. 6, with the difference that sole 78 further comprises cavities 102 similar to cavities 96 of lower matrix 92.

On installation of the stack of films in rolling mill 100, pads 62 are arranged in bulged areas 66 of back coating 64 and bulged areas 66 are arranged in cavities 102. During the rolling operation, back coating 64 is applied against film 86.

Back coating 64 may have the same structure as back coating 50 shown in FIG. 3 and may correspond to a multilayer structure comprising a PET layer sandwiched between two PVF layers. Back coating 64 may correspond to a single-layer structure, for example, a thermoplastic polyurethane film, a crystal polypropylene film, for example, the product commercialized by Basel under trade name Adstif EA600P, or a nanometer-scale structured thermoplastic material, for example, the material commercialized by Arkema under trade name Apolhia, PMMA such as, for example, the product commercialized by Arkema under trade name Altuglass, or reinforced elastomers based on a polyurethane or silicone or other multilayer laminates based on polyvinylidene polyfluoride (PVDF), polyethylene naphthalate (PEN), or polychlorotrifluoroethylene (PCTFE).

Figure 10:
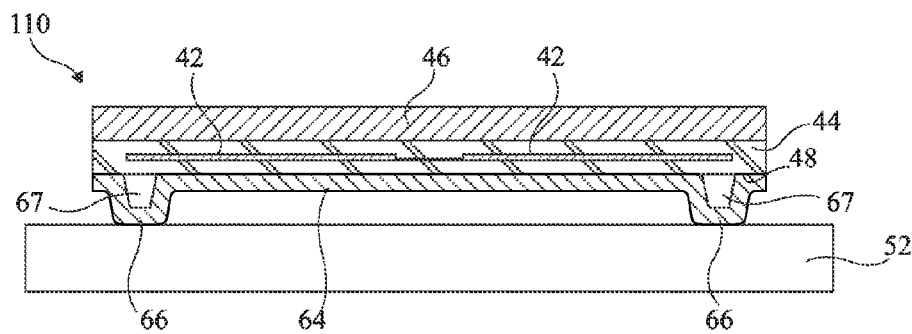
FIG. 10 is a partial simplified cross-section view of another embodiment of a photovoltaic module.

FIG. 10 shows another embodiment of a photovoltaic module 110 which has substantially the same structure as photovoltaic module 60 with the difference that pads 62 are not present. Housing 67 delimited by each bulged area 66 of back coating 64 may be filled with air or be partly or totally filled with the material of encapsulant 44. Back coating 64 may be formed by pressing as previously described in relation with FIG. 8.

The material forming back coating 64 has a softening temperature higher than the maximum temperatures used during the rolling operation so that back coating 64 substantially keeps its shape during the rolling operation. Preferably, the softening temperature of the material forming back coating 64 is greater than 120° C. It is, for example, PCTFE, reinforced PMMA such as, for example, the product commercialized by Evonik under trade name Plexiglass or the product commercialized by Arkema under trade name Altuglass. It may also be a material such as fibrous concrete or reinforced bitumen membrane.

Figure 11:
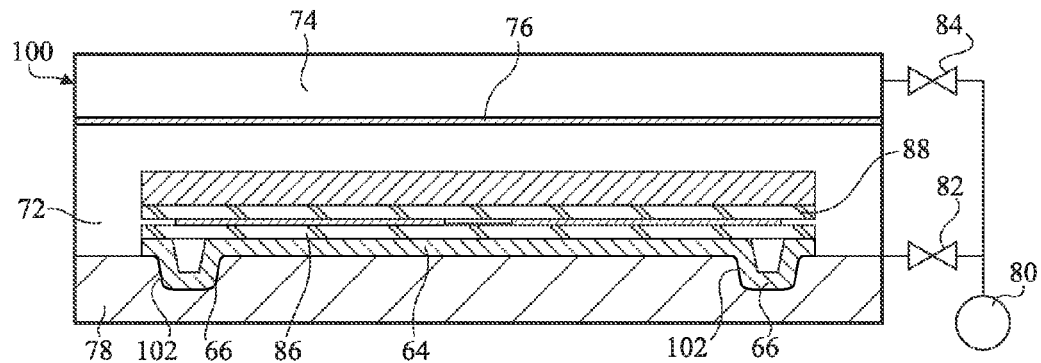
FIG. 11 illustrates a step of an embodiment of a method of manufacturing the photovoltaic module shown in FIG. 10.

FIG. 11 illustrates the rolling step on manufacturing of photovoltaic module 110. This step may be implemented with rolling mill 100 shown in FIG. 9. On installation of the stack of films in rolling mill 100, bulged layers 66 of back coating 64 are arranged in imprints 102. During the rolling operation, back coating 64 is applied against film 86, but bulged areas 66 do not substantially deform. During the polymerization step, the material forming encapsulant 44 may flow in housings 67 of bulged areas 66.

Figure 12:
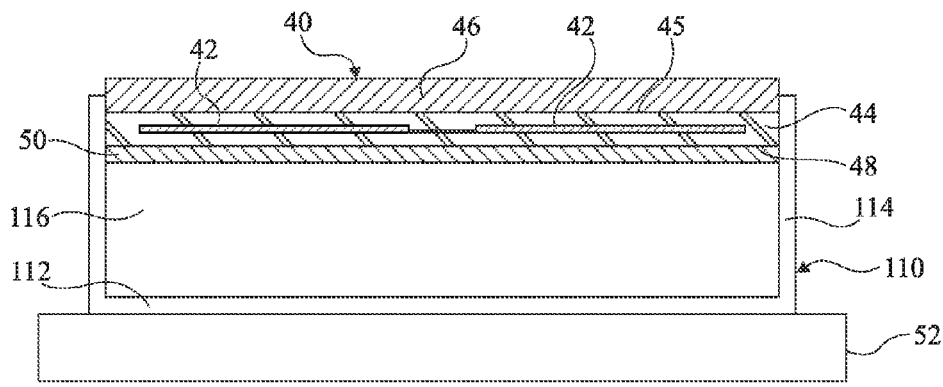
FIGS. 12 and 13 are partial simplified cross-section views of other embodiments of a photovoltaic module.
Figure 13:
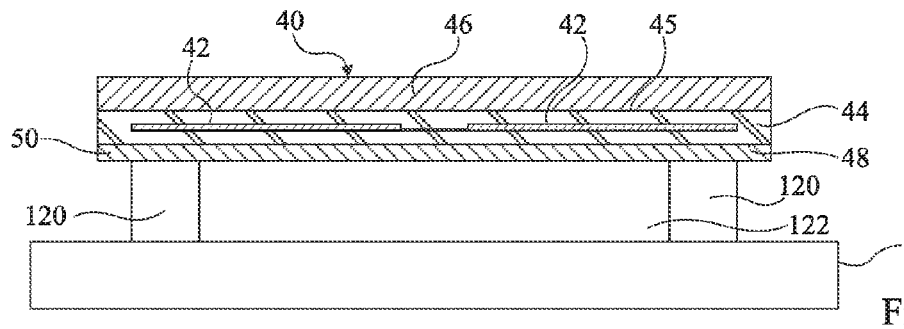

According to the embodiments described hereafter in relation with FIGS. 12 and 13, a spacer device is provided between photovoltaic module 40, shown in FIG. 3, and support 52 to keep an air film between photovoltaic module 40 and support 52. The presence of the air film enables to increase the breakdown voltage of the photovoltaic module.

FIG. 12 shows an embodiment where photovoltaic module 40 is held in a container 110. Container 110 comprises a bottom 112 resting on support 52 and lateral walls 114 having photovoltaic module 40 attached thereto. An air film 116 is kept between photovoltaic module 40 and bottom 112. As a variation, photovoltaic module 40 may be held in a bottomless frame which rests on support 52. Preferably, the material forming container 110 is selected to have a dielectric strength greater than or equal to 1 kW/mm. It is, for example, a low-cost plastic material, particularly polyvinyl chloride. Preferably, the material forming container 110 is selected to have a dielectric strength greater than or equal to that of air, that is, greater than or equal to 5 kW/mm.

FIG. 13 shows an embodiment where insulating feet 120 are attached to support 52 and photovoltaic module 40 rests on feet 120. An air film 122 is kept between photovoltaic module 40 and support 52, except for the areas of contact with feet 120. Feet 120 may be attached to support 52 by bonding, particularly, by using an epoxy glue. As a variation, feet 120 are formed by an operation of overmolding an insulating material on support 52. Preferably, the material forming feet 120 is selected to have a dielectric strength greater than or equal to 1 kW/mm. It for example is a low-cost plastic material, particularly polyvinyl chloride. Preferably, the material forming feet 120 is selected to have a dielectric strength greater than or equal to that of air, that is, greater than or equal to 5 kW/mm.

Specific embodiments have been described. Various alterations and modifications will occur to those skilled in the art. In particular, the previously-described embodiments may be implemented in the context of a concentration photovoltaic power plant.

Further, although an embodiment of photovoltaic power plant has been described where photovoltaic power plant 30 is connected to a three-phase electrical network 12, it should be clear that photovoltaic power plant 30 may be connected to a single-phase electrical network. In this case, only line $L_1$ is present and photovoltaic power plant may only comprise the fields 34 and the inverters 36 associated with this line. Further, it should be clear that photovoltaic power plant 30 may be connected to a polyphase electrical network other than a three-phase network, the previously-described assembly comprising fields 32 of photovoltaic modules, inverters 36, and inductance $S_1$, $S_2$ or $S_3$ associated with a line $L_1$, $L_2$ or $L_3$ being repeated for each line transporting a phase of the polyphase network.

Further, although photovoltaic module manufacturing methods implementing rolling operations have been described, the multilayer structure of the photovoltaic module protecting photovoltaic cells 42 may be formed in a press. Further, although photovoltaic module manufacturing methods implementing rolling or pressing operations have been described for the forming of back coating 64, the latter may be formed by injection molding.

The invention claimed is:

1. A photovoltaic power plant intended to be connected to a single-phase or polyphase electrical network, wherein an effective voltage of at least one phase is greater than or equal to 3 kV, the photovoltaic power plant comprising at least a first field of photovoltaic modules directly connected to a first inverter and a second field of photovoltaic modules directly connected to a second inverter, the first and second inverters being series-connected, the first inverter being connected to the electrical network, each photovoltaic module of the first field of photovoltaic modules having a breakdown voltage greater than or equal to 20 kV, and wherein there is no galvanic isolation between the network and the first and second fields of photovoltaic modules.

2. The photovoltaic power plant of claim 1, comprising at least one third field of photovoltaic modules directly connected to a third inverter, the third inverter being series-connected with the second inverter.

3. The photovoltaic power plant of claim 1, intended to be connected to a single-phase or polyphase electrical network wherein an effective voltage of at least one phase is in the range from 3 kV to 25 kV, wherein each photovoltaic module of the first field of photovoltaic modules has a breakdown voltage in the range from 20 kV to 130 kV and advantageously from 60 kV to 130 kV.

4. The photovoltaic power plant of claim 1, wherein all the photovoltaic modules of all the fields of photovoltaic modules of the photovoltaic power plant have a breakdown voltage greater than or equal to 20 kV.

5. The photovoltaic power plant of claim 1, intended to be connected to a three-phase electrical network having its effective composite voltages greater than 3 kV, comprising, for each phase of the electrical network, at least the first field of photovoltaic modules directly connected to the first inverter and the second field of photovoltaic modules directly connected to the second inverter, the first and second inverters being series-connected, the first inverter being connected to said phase, each photovoltaic module of the first field of photovoltaic modules having a breakdown voltage greater than or equal to 20 kV, and wherein there is no galvanic isolation between the network and the first and second fields of photovoltaic modules.

6. The photovoltaic power plant of claim 1, wherein each photovoltaic module of the first field rests on a support and comprises photovoltaic cells and a holding device for keeping an air film between the support and the photovoltaic cells.

7. The photovoltaic power plant of claim 6, wherein the photovoltaic cells are surrounded with an encapsulation layer forming first and second opposite surfaces, each photovoltaic module comprising a coating covering at least the most part of the first surface, the holding device being capable of keeping the air film between the support and the coating.

8. The photovoltaic power plant of claim 7, wherein the coating comprises protruding portions in contact with the support.

9. The photovoltaic power plant of claim 8, wherein at least one photovoltaic module of the first field further comprises, for each protruding portion, a pad between the coating and the first surface.

10. The photovoltaic power plant of claim 7, wherein each protruding portion delimits a housing filled with air or at least partly filled with the material forming the encapsulation layer.

11. The photovoltaic power plant of claim 8, wherein the height of each protruding portion varies from 1 mm to 20 mm.

* * * * *